United States Patent [19]

Taguchi

[11] Patent Number: 5,457,327
[45] Date of Patent: Oct. 10, 1995

[54] AVALANCHE PHOTODIODE WITH AN IMPROVED MULTIPLICATION LAYER

[75] Inventor: Kenko Taguchi, Tokyo, Japan

[73] Assignee: NEC Corporation, Tokyo, Japan

[21] Appl. No.: 257,024

[22] Filed: Jun. 8, 1994

[30] Foreign Application Priority Data

Jun. 8, 1993 [JP] Japan .................. 5-136361

[51] Int. Cl.[6] .................................. H01L 27/14
[52] U.S. Cl. .................. 257/21; 257/185; 257/186; 257/191; 257/438
[58] Field of Search .................. 257/186, 185, 257/187, 191, 192, 21, 438

[56] References Cited

FOREIGN PATENT DOCUMENTS

| | | | |
|---|---|---|---|
| 2246381 | 10/1990 | Japan | 257/21 |
| 3089566 | 4/1991 | Japan | 257/21 |
| 3116789 | 5/1991 | Japan | 257/21 |

OTHER PUBLICATIONS

Capasso et al., "Pseudo–Quaternary GaInAsP Semiconductors: A New $Ga_{0.47}In_{0.53}$ As/InP Graded Cap Superlattice And Its Applications To Avalanche Photodiodes", *Appl. Phys. Lett.* 45(11), 1 Dec. 1984, pp. 1193–1195.
By R. Chin et al., "Impact Ionisation in Multilayered Heterojunction Structures", Electronics Letters, Jun. 5, 1980, vol. 16, No. 12, pp. 467–469.
By F. Capasso et al., "Staircase Solid–State Photomultipliers and Avalanche Photodiodes with Enhanced Ionization Rates Ratio", IEEE Transactions on Electron Devices, Apr. 1983, vol. ED–30, No. 4, pp. 381–390.
By K. Mohammed et al., "New high–speed long–wavelength $Al_{0.43}In_{0.52}As/Ga_{0.53}As$ multiquantum wall avalanche photo–diodes", Applied Physic Letters, Sep. 15, 1985, vol. 47, No. 15, pp. 597–599.
By T. Kagawa et al., "Impact ionization rates in an InGaAs/InAlAs superlattice", Applied Physic Letters, Sep. 4, 1989, vol. 55, No. 10, pp. 993–995.

Primary Examiner—William Mintel
Attorney, Agent, or Firm—Young & Thompson

[57] ABSTRACT

The invention provides an avalanche photodiode multilayer structure comprising an absorption layer for absorbing photons and subsequent generation of electron hole pairs, a field relaxation layer in contact with the absorption layer and a multiplication layer in contact with the field relaxation layer. The multiplication layer comprises a plurality of periods of first and second layers. The first layer has a first graded energy band gap being gradually increased in a direction toward which traveling electrons are being accelerated by a predetermined electric field. The second layer has a second graded energy band gap being gradually decreased in the same direction. Both a conduction band edge and a valance band edge are free from any discontinuities and are sloped down toward the same direction through the first and second layers when the first and second layers are being applied with the electric field.

52 Claims, 4 Drawing Sheets

FIG. 1

PHOTON (hν)

PHOTON (hν)

AVALANCHE PHOTODIODE WITH AN IMPROVED MULTIPLICATION LAYER

BACKGROUND OF THE INVENTION

The invention relates to an avalanche photodiode having separate absorption and multiplication layers.

Among photodetectors, avalanche photodiodes are attractive due to the characteristics high sensitivity and fast response. As could be well-known, the most important factor for producing a highly sensitive avalanche photodiode is the signal to noise ratio. The value of the signal to noise ratio depends upon an impact ionization rate in an avalanche region. Producing a highly sensitive avalanche photodiode requires a high impact ionization rate. Avalanche photodiodes made of compound semiconductors include Ge or InP/InGaAs heterostructure. The signal to noise ratio values of the above conventional avalanche photodiodes are approximately ranged from 1 to 3 only. Much higher impact ionization rate is required to obtain a much higher sensitive avalanche photodiode.

In the prior art, it is known that the impact ionization rate of the avalanche region in the avalanche photodiode can be enhanced providing a superlattice structure therein so that electrons are accelerated traveling from a barrier layer into a quantum well layer. The electrons may receive an energy corresponding to a conduction band gap discontinuity when traveling from a barrier layer into a quantum well layer. The accelerated electrons may contribute to an improvement in the impact ionization rate. One of the conventional superlattice avalanche photodiodes is disclosed in Electronics Letters 5th Jun. 1980 Vol. 16 No. 12 pp. 467–469. Another type of conventional superlattice avalanche photodiodes is disclosed in Applied Physics Letters Vol. 47(6), September 1985, pp. 597–599. A result of the measurement of the impact ionization rate was reported by Kagawa et al. in Applied Physics Letters Vol. 55. 1989, pp. 993–995. In the above publications, it was reported that the superlattice structure such as InGaAs/InAlAs can improve the impact ionization rate. However, such improvement is absent in a bulk structure.

Such conventional avalanche photodiodes having the superlattice structure in the avalanche region are however entangled with serious difficulties as described below. The superlattice structure in the avalanche region involved in the conventional avalanche photodiode has a step-like energy band gap profile or energy band gap discontinuities at interfaces of the well layers and the barrier layers. As described above, when carriers travel from the barrier layer having a large energy band gap into the well layer having a small energy band gap, the carriers may receive an energy corresponding to the energy band gap discontinuity so that the carriers are accelerated for improvement in the impact ionization. By contrast, however, when the carriers travel from the well layer toward the barrier layer biased in the reverse direction, the carriers are forced to experience a potential barrier due to a large energy band gap discontinuity, thereby the carriers tend to accumulate in the well layer. This may impede the avalanche photodiode to obtain a fast response. The normal superlattice structure having the step-like energy band gap profile is unable to permit the avalanche photodiode to obtain a high speed performance or a fast response.

To solve the high speed performance problem of the avalanche photodiode, it is important to reduce or remove an energy band gap discontinuity constituting a potential barrier against carriers. It is disclosed in IEEE Transaction on Electron Devices, Vol. ED-30, No. 4, April 1983 to compositionally grade an avalanche region to reduce a potential barrier against electrons when the avalanche photodiode is reverse-biased.

The above compositionally graded avalanche photodiode, however, has a disadvantage because of an existence of a potential barrier against holes. In practice, when photons are absorbed into an absorption region in the avalanche photodiode, electron-hole pairs are generated. The generated electrons and holes travel toward the cathode and anode electrodes respectively. One may assume that when the electrons are travelling through the avalanche region, the holes are traveling in the opposite direction to that of the electrons. The holes experience a step like potential barrier due to a valance band discontinuity. Thus, some holes tend to accumulate in the step like potential barriers due to the valance band discontinuity. The accumulation of the holes at the step like potential barrier may impede the holes to travel toward the anode electrode thereby delaying the arrival of holes at the anode electrode. This translates to a delay in transmission of signals at the opposite electrodes or the cathode and anode electrodes. Therefore, this leads to a difficulty in allowing the avalanche photodiode to obtain a high speed performance. This is a very serious problem.

It is therefore necessary to have the electrons and holes traveling through the avalanche region free from any step-like potential barrier due to conduction or valance band discontinuities, thus, permitting the avalanche photodiode to have a fast response and keeping a high sensitivity level due to a high impact ionization rate.

SUMMARY OF THE INVENTION

Accordingly, it is a primary object of the present invention to provide a novel avalanche photodiode free from any problem as described above.

It is a further object of the present invention to provide a novel avalanche photodiode which produces a high speed performance and a fast response.

It is yet a further object of the present invention to provide a novel avalanche photodiode having an improved avalanche region or multiplication layer freeing electrons from any potential barriers caused by conduction band discontinuities.

It is a still further object of the present invention to provide a novel avalanche photodiode having an improved avalanche region or multiplication layer freeing holes from any potential barriers caused by valance band discontinuities.

It is a further object of the present invention to provide a novel avalanche photodiode which possesses a high sensitivity level.

It is a further object of the present invention to provide a novel avalanche photodiode having an improved avalanche region or multiplication layer which permits a high impact ionization rate.

It is an additional object of the present invention to provide a novel avalanche photodiode possessing a high cut off frequency performance.

The above and other objects, features and advantages of the present invention will be apparent from the following descriptions.

The present invention provides an avalanche multilayer structure involved in an avalanche photodiode. The avalanche multilayer structure comprises a plurality of periods of first and second layers. The first layer has a first graded energy band gap being gradually increased in a direction traveling electrons are being accelerated by a predetermined electric field. The second layer has a second graded energy band gap being gradually decreased in the same direction. A conduction band edge and a valance band edge are free from any discontinuities so as to be sloped down toward the direction through the first and second layers when the first and second layers are applied with the electric field. The first layer has a first thickness and has a graded energy band gap being proportionally increased in a direction from a minimum value to a maximum value. The second layer has a second thickness smaller than the first thickness and has a graded energy band gap proportionally decreased in a direction from a maximum value to a minimum value. The first and second layers are made of a compositionally graded $In_XAl_YGa_{1-X-Y}As$ ($0.52 \leq X \leq 0.53$, $0Y \leq 0.48$). Each one of the above periods may further comprise a third and a fourth layer. The third layer is in contact with the first layer. The third layer is in contact with the first layer. The third layer has a third graded energy band gap being gradually increased in a direction traveling electrons are being accelerated by a predetermined electric field. The fourth layer is in contact with the third and fourth layers at its opposite sides. The fourth layer has a fourth graded energy band gap being gradually decreased in the same direction. Both a conduction band edge and a valance band edge are free from any discontinuities and are sloped down toward the same direction through the first to fourth layers when the first to fourth layers are applied with the electric field.

The present invention also provides an avalanche photodiode comprising a semiconductor substrate, a buffer layer formed on the semiconductor substrate, a multiplication layer formed on the buffer layer, a field relaxation layer formed on the multiplication layer, an absorption layer formed on the field relaxation layer for absorbing photons and subsequent generation of electron hole pairs, a cap layer formed on the absorption layer, a contact layer formed on the cap layer, an anode electrode provided on a top surface of the contact layer, and a cathode electrode provided on a bottom surface of the semiconductor substrate. The multiplication layer may be comprised of a plurality of periods of first and second layers in which the first layer has a first graded energy band gap being gradually increased in a direction traveling electrons are being accelerated by a predetermined electric field, and the second layer has a second graded energy band gap being gradually decreased in the same direction so that both a conduction band edge and a valance band edge are free from any discontinuities and are sloped down toward the same direction through the first and second layers when the first and second layers are being applied with the electric field. The first layer has a thickness of 150 angstroms and has a graded energy band gap being proportionally increased in the direction from a minimum value of 0.75 eV up to a maximum value of 1.45 eV. The second layer has a thickness of 50 angstroms and has a graded energy band gap being proportionally decreased in the direction from the maximum value down to the minimum value. The first and second layers are made of a compositionally graded $In_XAl_YGa_{1-X-Y}As$ ($0.52 \leq X \leq 0.53$, $0 \leq Y \leq 0.48$). Each of the above periods may further comprise a third layer and a fourth layer. The third layer is in contact with the first layer. The third layer has a third graded energy band gap being gradually increased in a direction toward which traveling electrons are being accelerated by a predetermined electric field. The fourth layer is in contact with the fourth and third layers at its opposite sides. The fourth layer has a fourth graded energy band gap being gradually decreased in the direction sot that both a conduction band edge and a valance band edge are free from any discontinuity and sloped down toward the direction through the first to fourth layers when the first to fourth layers are applied with the electric field.

The present invention also provides an avalanche photodiode comprising a semiconductor substrate having a first conductivity type a buffer layer having a first conductivity type formed on the semiconductor substrate, an absorption layer having the first conductivity type formed on the buffer layer for absorbing photons and subsequent generation of electron hole pairs, a field relaxation layer having said first conductivity type formed on the absorption layer, a multiplication layer having the first conductivity type formed on the field relaxation layer, a layer having a second conductivity type formed on the multiplication layer, a cathode electrode provided on a top surface of the second conductivity type layer and an anode electrode provided on a bottom surface of the semiconductor substrate. The multiplication layer may be comprised of a plurality of periods of first and second layers in which the first layer has a first graded energy band gap being gradually increased in a direction toward which traveling electrons are being accelerated by a predetermined electric field and the second layer has a second graded energy band gap gradually being decreased in the direction so that both a conduction band edge and a valance band edge are free from any discontinuities and are sloped down toward the direction through the first and second layers when the first and second layers are applied with the electric field.

BRIEF DESCRIPTION OF THE DRAWINGS

Preferred embodiments of the present invention will hereinafter be fully described in detail with reference to the accompanying drawings.

DESCRIPTIONS OF THE INVENTION

The present invention provides a novel avalanche photodiode with an improved multiplication multilayer structure which has a high impact ionization rate providing a high multiplication factor. The improved multiplication multilayer structure may be made of compositionally graded quaternary compound semiconductors permitting the multiplication layer to be free from any step-like potential barriers against either electrons or holes. Namely, the compositionally graded multiplication layer possesses neither conduction band gap discontinuity nor valance band gap discontinuity so that both the conduction band edge and the valance band edge are always sloped down toward which electrons are being accelerated by an electric field for a reverse-biasing of the avalanche photodiode. The compositionally graded multiplication layer permits the avalanche photodiode to obtain a high frequency and high speed performance. This provides the avalanche photodiode with a high cut off frequency and a fast response.

Figure 1:
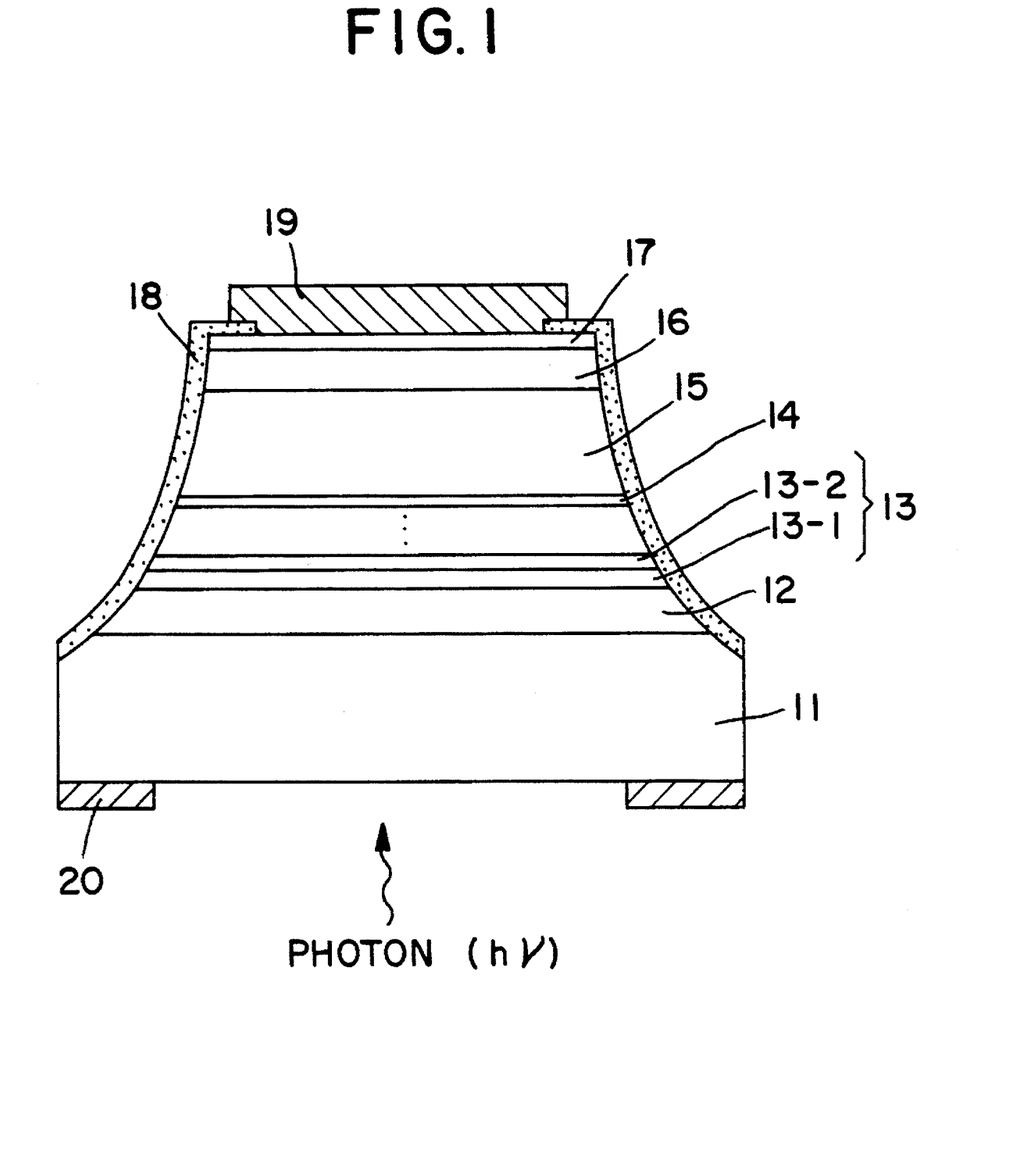
FIG. 1 is a fragmentary cross-section elevational view illustrative of an avalanche photodiode within an improved multiplication layer in a first embodiment according to the present invention.
Figure 2:
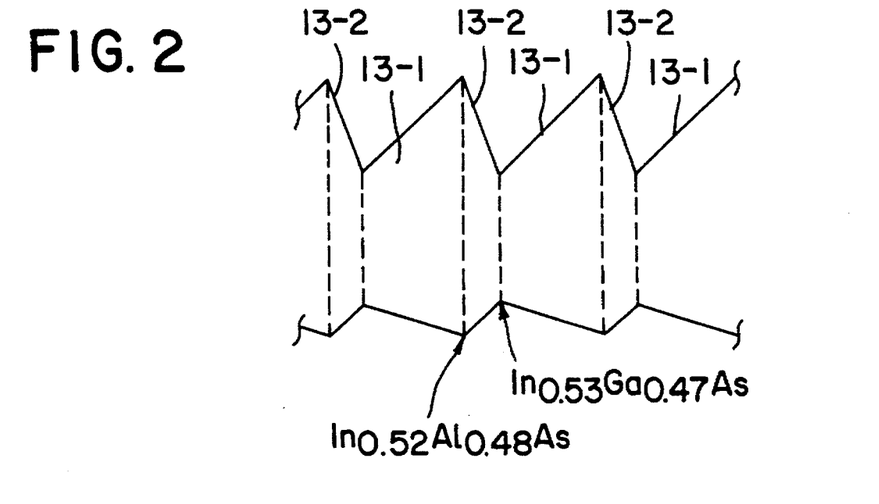
FIG. 2 is an energy band gap profile of an improved multiplication layer of an avalanche photodiode in a non-biased state of a first embodiment according to the present invention.
Figure 3:
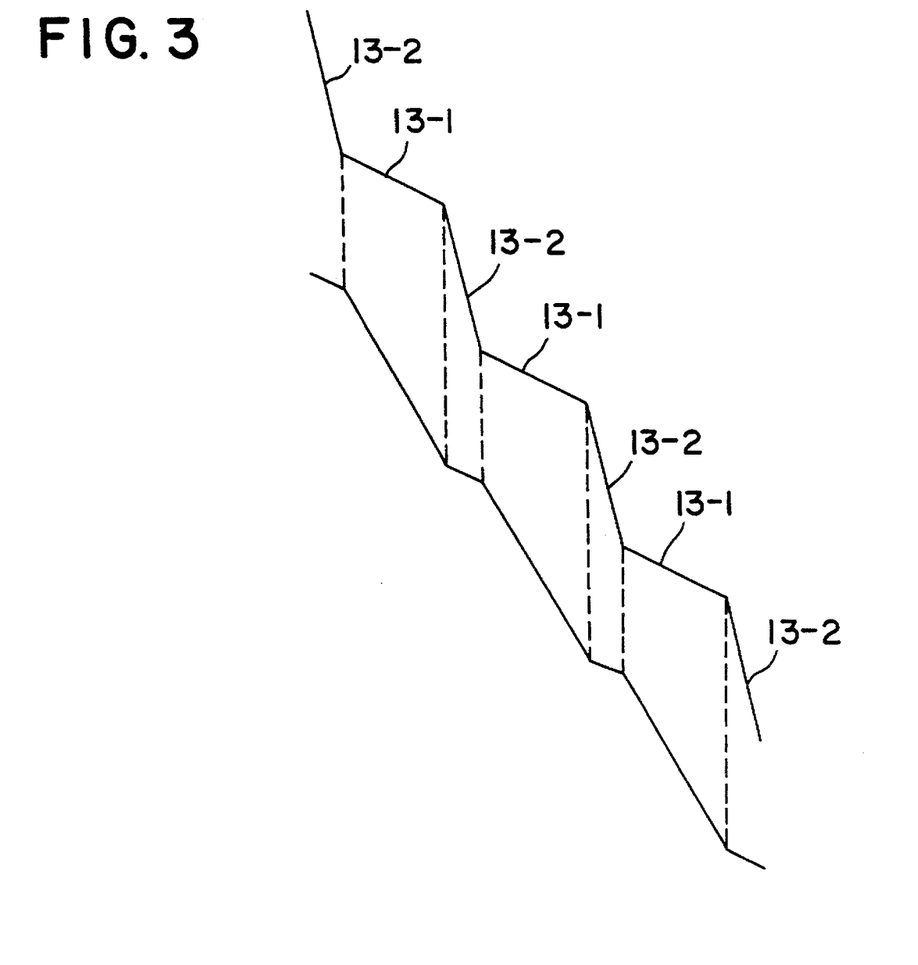
FIG. 3 is an energy band gap profile of an improved multiplication layer of an avalanche photodiode in a reverse-biased state of a first embodiment according to the present invention.

A first embodiment according to the present invention will be described in detail with reference to FIGS. 1 to 3 in which a novel avalanche photodiode with an improved multiplication layer made of compositionally graded compound semiconductor is provided.

The novel avalanche photodiode has an $n^+$-InP substrate 11. An $n^+$-InP buffer layer 12 having a thickness of 1 micrometer and an impurity concentration of $1\times10^{18}$ cm$^{-3}$ is formed on the $n^+$-InP substrate 11. A multiplication layer 13 made of a compositionally graded n-In$_x$Al$_y$Ga$_{1-x-y}$As ($0.52 \leq X \leq 0.53$, $0 \leq Y \leq 0.48$) with an impurity concentration of $1\times10^{15}$ cm$^{-3}$ is formed on the $n^+$-InP buffer layer 12 so that the compositionally graded In$_x$Al$_y$Ga$_{1-x-y}$As multiplication layer 13 is lattice matched to the $n^+$-InP buffer layer 12. The compositionally graded In$_x$Al$_y$Ga$_{1-x-y}$As multiplication layer 13 may comprise fifteen periods of compositionally graded first and second layers 13-1 and 13-2. The first layer 13-1 made of n-In$_x$Al$_y$Ga$_{1-x-y}$As ($0.52 \leq X \leq 0.53$, $0 \leq Y \leq 0.48$) is compositionally graded downward from In$_{0.53}$Ga$_{0.47}$As to In$_{0.52}$Al$_{0.48}$As so that the first layer 13-1 may have a first graded energy band gap which is proportionally increased correspondingly from a minimum value of 0.75 eV to a maximum value of 1.45 eV. The first layer 13-1 has a thickness of 150 angstroms. The second layer 13-2 made of In$_x$Al$_y$Ga$_{1-x-y}$As ($0.52 \leq X \leq 0.53$, $0 \leq Y \leq 0.48$) is compositionally graded downward from In$_{0.52}$Al$_{0.48}$As to In$_{0.53}$Ga$_{0.47}$As so that the second layer 13-2 may have a second graded energy band gap which is being proportionally decreased correspondingly from the maximum value of 1.45 eV to the minimum value of 0.75 eV. The second layer 13-2 has a thickness of 50 angstroms so as to have at least a thinner thickness than that of the first layer 13-2. Thus a pair of first and second layers 13-1 and 13-2 has a thickness of 200 angstroms. The compositionally graded multiplication layer 13 comprising the fifteen periods of the first and second layers 13-1 and 13-2 has a thickness of 0.3 micrometers. A p-In$_{0.52}$Al$_{0.48}$As field relaxation layer 14 having a thickness of 830 angstroms with an impurity concentration of $3\times10^{17}$ cm$^{-3}$ is formed on the compositionally graded multiplication layer 13. A p-In$_{0.53}$Al$_{0.47}$As absorption layer 15 having a thickness of 1.3 micrometers with an impurity concentration of $1\times10^{15}$ cm$^{-3}$ is formed on the field relaxation layer 14. A p-InP cap layer 16 having a thickness of 1 micrometer with an impurity concentration of $1\times10^{18}$ cm$^{-3}$ is formed on the absorption layer 15. A $p^+$-In$_{0.53}$Ga$_{0.47}$As contact layer 17 having a thickness 100 angstroms with an impurity concentration of $1\times10^{19}$ cm$^{-3}$ is formed on the cap layer 16. The above layers may be grown by a molecular beam epitaxy method on the semiconductor substrate 11 to form a wafer. The wafer is subsequently subjected to a lithography and a mesa etching to be shaped as illustrated in FIG. 1. A mesa portion formed on the semiconductor substrate 11 is covered with an insulation film 18 made of silicon nitride except for a top surface of the contract layer 17 on which an anode electrode 19 is provided. A cathode electrode is provided on a bottom surface of the semiconductor substrate 11. It is possible to provide a window for receiving photons either at the top or bottom portion of the avalanche photodiode, in this embodiment, the window for receiving photons is provided on the bottom surface of the semiconductor substrate 11. The cathode on the bottom surface of the semiconductor substrate 11 has the window through which photons are received. Although the window may be comprised of transparent material, in this embodiment, the window comprises an opening formed in the cathode electrode 20.

The novel avalanche photodiode may function as a photo detector by reverse-biased anode and cathode electrodes 19 and 20. A photon or a plurality of photons are received through the window provided on the bottom surface of the semiconductor substrate 11. The photons are then propagated through the semiconductor substrate 11, the buffer layer 12, the compositionally graded multiplication layer 13, the field relaxation layer 14 into the absorption layer 15 by which the photons may be absorbed. This absorption of photons by the absorption layer 15 generates electron-hole pairs, both of which may serve as negative and positive carriers. Since the anode and cathode electrodes have already been biased in the reverse direction, the electrons and holes generated by the photon absorption are accelerated toward the cathode and anode electrodes 19 and 20 respectively. Namely, the holes are traveled through the cap layer 16 and the contact layer 17 for subsequent arrival at the anode electrode 19. By contrast, the electrons generated by the photon absorption phenomenon may be traveled from the absorption layer 15 through the field relaxation layer 14 and the compositionally graded multiplication layer 13 where a large multiplication of the electron current appears. The electrons are further traveled through the buffer layer 12 and the semiconductor substrate 11 to the cathode electrode. Arrivals of the electrons and holes at the cathode and anode electrodes 20 and 19 respectively, means that the avalanche photodiode has just detected a photon or a plurality of photons.

The description will focus on the mechanism of impact ionization effect and transportation of electrons and holes in the improved multiplication layer 13. When the compositionally graded n-In$_x$Al$_y$Ga$_{1-x-y}$As multiplication layer 13 is not biased, the energy band gap profile of the first and second layers 13-1 and 13-2 is as illustrated in FIG. 2 from which the compositional variation permits the compositionally graded n-In$_x$Al$_y$Ga$_{1-x-y}$As multiplication layer 13 to be free from either any discontinuities or step-like rapid variation of each of the conduction band edge and the valance band edge. When the compositionally graded multiplication layer 13 is reverse-biased, the energy band gap profile is as illustrated in FIG. 3. When reverse-biased, both the conduction band edge and the valance band edge of the compositionally graded multiplication layer 13 are always sloped down in a direction toward which traveling electrons are being accelerated by an electric field due to the reverse-bias applied to the avalanche photodiode. This enables electrons to travel down on the conduction band edge being always sloped downward without experiencing any potential barrier. This also enables holes to travel up on the valance band edge being always sloped upward without experiencing any potential barrier. It would be extremely important to note that to realize a high frequency and high speed performance, not only electrons but also holes may travel on the conduction and valance band edges without experiencing any potential barrier.

The above improved compositionally graded multiplication layer 13 permits the electrons and holes to reach the cathode and anode electrodes without experiencing any potential barrier within a very short time after the photons were absorbed by the absorption layer 15. This permits the avalanche photodiode to achieve a very high speed performance and possesses an extremely high cut off frequency property or a high frequency performance. The above compositionally graded multiplication layer 13 further permits a large impact ionization rate providing a high multiplication factor. This further permits the avalanche photodiode to possess a very high sensitivity. In this embodiment, 5 or more high impact ionization rates for the electrons and holes are obtained. The multiplication factor of 10 or more and a high frequency performance of 150 GHz are obtained.

Figure 4:
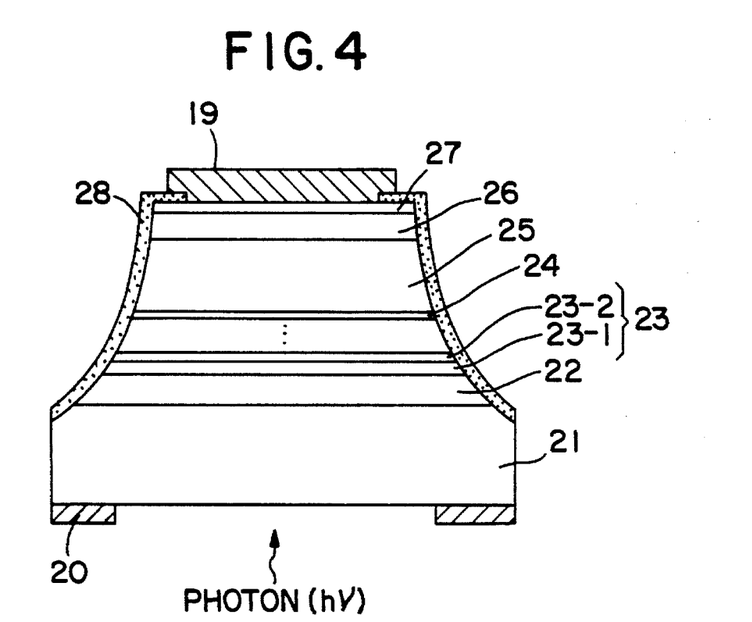
FIG. 4 is a fragmentary cross-section elevational view illustrative of an avalanche photodiode within an improved multiplication layer in a second embodiment according to the present invention.
Figure 5:
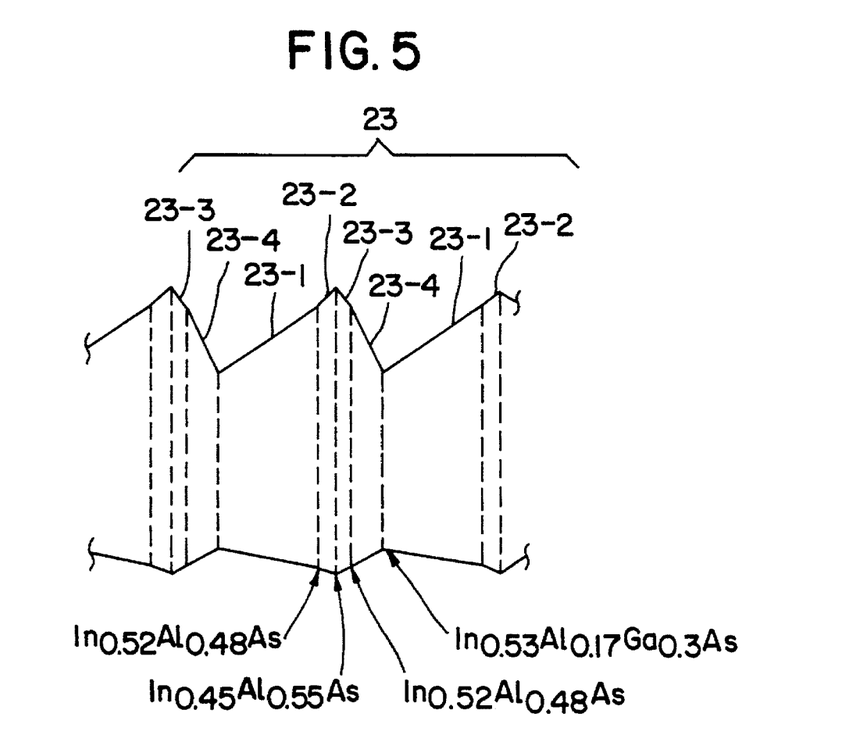
FIG. 5 is an energy band gap profile of an improved multiplication layer of an avalanche photodiode in a non-biased state of a second embodiment according to the present invention.

A second embodiment according to the present invention will be described in detail with reference to FIGS. 4 and 5 in which a novel avalanche photodiode with an improved multiplication layer made of compositionally graded compound semiconductors is provided.

The novel avalanche photodiode has an $n^+$-InP substrate 21. An $n^+$-InP buffer layer 22 having a thickness of 1 micrometer and an impurity concentration of $1 \times 10^{18}$ cm$^{-3}$ is formed on the $n^+$-InP substrate 21. A multiplication layer 23 made of a compositionally graded n-$In_xAl_yGa_{1-x-y}As$ ($0.45 \leq X \leq 0.53$, $0.17 \leq Y \leq 0.55$) with an impurity concentration of $1 \times 10^{15}$ cm$^{-3}$ is formed on the $n^+$-InP buffer layer 22. The compositionally graded $In_xAl_yGa_{1-x-y}As$ multiplication layer 23 may comprise fifteen periods of compositionally graded first to fourth layers 23-1 to 23-4. The first layer 23-1 made of N-$In_xAl_yGa_{1-x-y}As$ ($0.52 \leq X \leq 0.53$, $0.17 \leq Y \leq 0.48$) is compositionally graded downward from $In_{0.53}Al_{0.17}Ga_{0.3}As$ to $In_{0.52}Al_{0.48}As$ so that the first layer 23-1 may have first graded energy band gap which is being proportionally increased from a minimum value of 0.95 eV. The first layer 23-1 has a thickness of 150 angstroms. The second layer 23-2 is in contact with the first layer 23-1. The second layer 23-2 is made of n-$In_xAl_yGa_{1-x-y}As$ ($0.45 \leq X \leq 0.52$, $0.48 \leq Y \leq 0.55$) compositionally graded downward from $In_{0.52}Al_{0.48}As$ to $In_{0.45}Al_{0.55}As$ so that the second layer 23-2 may have a second graded energy band gap which is proportionally increased to a maximum value of 1.57 eV. The second layer 23-2 has a thickness of 20 angstroms. The third layer 23-3 is in contact with the second layer 23-2. The third layer 23-2 is made of n-$In_xAl_yGa_{1-x-y}As$ ($0.45 \leq X \leq 0.53$, $0.17 \leq Y \leq 0.55$) compositionally graded downward from $In_{0.45}Al_{0.55}As$ to $In_{0.52}Al0.48As$ so that the third layer 23-3 may have a third graded energy band gap which narrows proportionally downward from the maximum value of 1.57 eV. The third layer 23-3 has a thickness of 10 angstroms. The fourth layer 23-4 is in contact with the third layer 23-3. The fourth layer 23-4 is made of n-$In_xAl_yGa_{1-x-y}As$ ($0.52 \leq X \leq 0.53$, $0.17 \leq Y \leq 0.48$) compositionally graded downward from $In_{0.52}Al_{0.48}As$ to $In_{0.53}Al_{0.17}Ga_{0.3}As$ so that the third layer 23-4 may have fourth graded energy band gap which narrows proportionally downward to the minimum value of 0.95 eV. The fourth layer 23-4 has a thickness of 50 angstroms. Thus a quadruplet of the first to fourth layers 23-1 and 23-4 has a thickness of 230 angstroms. The compositionally graded multiplication layer 23 comprising the fifteen periods of the first to fourth layers 23-1 and 23-4 has a thickness of 0.345 micrometers. A p-$In_{0.52}Al_{0.48}As$ field relaxation layer 24 having a thickness of 830 angstroms with an impurity concentration of $3 \times 10^{17}$ cm$^{-3}$ is formed on the compositionally graded multiplication layer 13. A p-$In_{0.53}Al_{0.47}As$ absorption layer 25 having a thickness of 1.3 micrometers with an impurity concentration of $1 \times 10^{15}$ cm$^{-3}$ is formed on the field relaxation layer 24. A p-InP cap layer 26 having a thickness of 1 micrometer with an impurity concentration of $1 \times 10^{18}$ cm$^{-3}$ is formed on the absorption layer 25. A $p^+$-$In_{0.53}Ga_{0.47}As$ contact layer 27 having a thickness 100 angstroms with an impurity concentration of $1 \times 10^{19}$ cm$^{-3}$ is formed on the cap layer 26. The above layers may be grown by a molecular beam epitaxy method on the semiconductor substrate 21 to form a wafer. The wafer is subsequently subjected to a lithography and a mesa etching to be shaped as illustrated in FIG. 4. A mesa portion formed on the semiconductor substrate 21 is covered with an insulation film 28 made of silicon nitride except for a top surface of the contact layer 27 on which an anode electrode 19 is provided. A cathode electrode is provided on a bottom surface of the semiconductor substrate 21. Wherein it is possible to provide a window for receiving photons either top or bottom portion of the avalanche photodiode, in this embodiment the window for receiving photons is provided on the bottom surface of the semiconductor substrate 21. Then, the cathode provided on the bottom surface of the semiconductor substrate 21 has the window through which photons are received. Although the window may be comprised of a transparent material, in this embodiment the window comprises an opening formed in the cathode electrode 20.

The novel avalanche photodiode may function as a photo detector by reverse-biasing the anode and cathode electrodes 19 and 20. A photon or a plurality of photons are received through the window provided on the bottom surface of the semiconductor substrate 21. The photons are then propagated through the semiconductor substrate 21, the buffer layer 22, the compositionally graded multiplication layer 23, the field relaxation layer 24 into the absorption layer 25 by which the photons may be absorbed. This absorption of photons by the absorption layer 25 generates electron-hole pairs, both of which may serve as negative and positive carriers. Since the anode and cathode electrodes have already been reverse-biased, the electrons and holes generated by the photon absorption are being accelerated toward the cathode and anode electrodes 19 and 20 respectively. Namely, the holes are traveled through the cap layer 26 and the contact layer 27 for subsequent arrival at the anode electrode 19. By contrast, the electrons generated by the photon absorption phenomenon may be traveled from the absorption layer 25 through the field relaxation layer 24 and the compositionally graded multiplication layer 23 where a large multiplication of the electron current appears. The electrons are further traveled through the buffer layer 22 and the semiconductor substrate 21 to the cathode electrode. Arrivals of the electrons and holes at the cathode and anode electrodes 20 and 19 respectively, means that the avalanche photodiode has just detected a photon or a plurality of photons.

The description will focus on the mechanism in impact ionization effect and the transportation of electrons and holes in the improved multiplication layer 23. When the compositionally graded n-$In_xAl_yGa_{1-x-y}As$ multiplication layer 23 is not biased, the energy band gap profile of the first to fourth layers 23-1 to 23-4 as illustrated in FIG. 5 from which the compositional variation permits the compositionally graded n-$In_XAl_YGa_{1-X-Y}As$ multiplication layer 23 to be free form either any discontinuities or step-like rapid variation of each of the conduction band edge and the valance band edge. When the compositionally graded multiplication layer 23 is reverse-biased, the energy band gap profile is not so different as illustrated in FIG. 3. In this embodiment, the multiplication layer 23 is so designed that a difference between the minimum and maximum values of the energy band gap is larger than that of the first embodiment to enhance acceleration of electrons and holes to obtain a higher impact ionization rate than that of the first embodiment.

When reverse-biased, both the conduction band edge and the valance band edge of the compositionally graded multiplication layer 23 are always sloped down in a direction toward which traveling electrons are being accelerated by an electric field due to the reverse-biasing applied to the avalanche photodiode. This permits electrons to travel down on the conduction band edge being always sloped down without experiencing any potential barrier. This also permits holes to travel up on the valance band edge being always sloped up without experiencing any potential barrier. It would be extremely important to note that for realizing a high frequency and high speed performance, not only electrons but also holes may travel on the conduction and valance band edges without experiencing any potential barrier.

The above improved compositionally graded multiplication layer 23 permits the electrons and holes to reach the cathode and anode electrodes without experiencing any potential barrier within a very short time after the photons were absorbed by the absorption layer 25. The permits the avalanche photodiode to achieve a very high speed performance and possesses an extremely high cut off frequency property or a high frequency performance. The above compositionally graded multiplication layer 23 further permits a large impact ionization rate which may provide a high multiplication factor. This further permits the avalanche photodiode to become highly sensitive. In this embodiment, 6 or more high impact ionization rates for the electrons and holes are obtained. The multiplication factor of more than 10 and a high frequency performance of more than 150 GHz are obtained.

Figure 6:
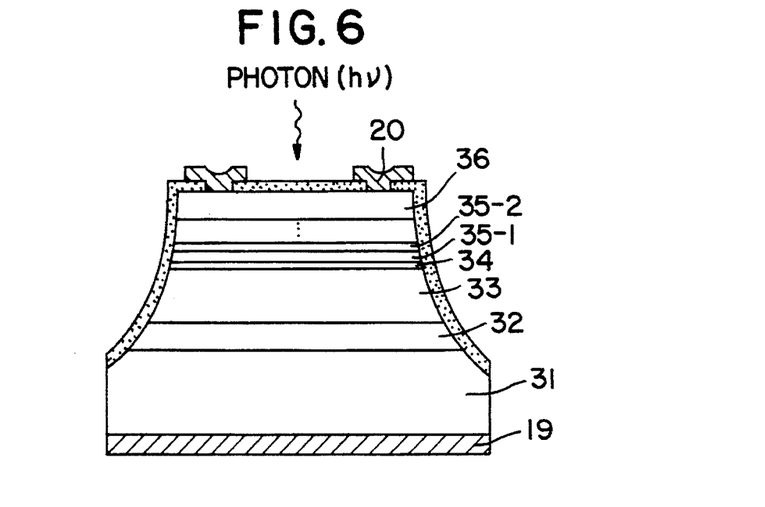
FIG. 6 is a fragmentary cross-section elevational view illustrative of an avalanche photodiode within an improved multiplication layer of a third embodiment according to the present invention.

A third embodiment according to the present invention will be described in detail with reference to FIGS. 6 and 7 in which a novel avalanche photodiode with an improved multiplication layer made of compositionally graded compound semiconductors is provided.

The novel avalanche photodiode has a $p^+$-InP substrate 31. A $p^+$-InP buffer layer 32 having a thickness of 1 micrometer and an impurity concentration of $1\times10^{18}$ $cm^{-3}$ is formed on the $p^+$-InP substrate 31. A p-$In_{0.53}Al_{0.47}As$ absorption layer 33 having a thickness of 1.3 micrometers with an impurity concentration of $1\times10^{15}$ $cm^{-3}$ is formed on the buffer layer 32. A p-$In_{0.52}Al_{0.48}As$ field relaxation layer 34 having a thickness of 800 angstrom with an impurity concentration of $3\times10^{17}$ $cm^{-3}$ is formed on the absorption layer 33. A multiplication layer 35 made of a compositionally graded $In_XAl_YGa_{1-X-Y}As$ ($0.52 \leq X \leq 0.53$, $0.17 \leq Y \leq 0.48$) with both impurity concentrations of $3\times10^{16}$ $cm^{-3}$ and $1\times10^{15}$ $cm^{-3}$ is formed on the field relaxation layer 34. The compositionally graded p-$In_XAl_YGa_{1-X-Y}As$ multiplication layer 35 may comprise fifteen periods of compositionally graded first and second layers 35-1 and 35-2. The first layer 35-1 made of n-$In_XAl_YGa_{1-X-Y}As$ ($0.52 \leq X \leq 0.53$, $0.17 \leq Y \leq 0.48$) is compositionally graded downward from $In_{0.52}Al_{0.48}Ga_{0.3}As$ to $In_{0.52}Al_{0.48}As$ so that the first layer 35-1 may have a first graded energy band gap which is proportionally increased correspondingly from a minimum value of 0.95 eV to a maximum value of 1.45 eV. The first layer 35-1 has a thickness of 180 angstroms. The first layer 35-1 further comprises a high impurity concentration layer 35-12 having an impurity concentration of $3\times10^{16}$ $cm^{-3}$ in which the energy band gap has the maximum value, and a low impurity concentration layer 35-11 having an impurity concentration of $1\times10^{15}$ $cm^{-3}$. The high impurity concentration layer 35-12 has a thickness of 20 angstroms, while the low impurity concentration layer 35-11 has a thickness of 160 angstroms. The existence of the high impurity concentration layer 35-12 may cause a higher electric field which is able to further enhance an acceleration of electrons and holes for obtaining a higher impact ionization rate. Namely, the high impurity concentration layer 35-12 may greatly accelerate the electrons and holes. The second layer 35-2 is in contact with the first layer 35-1. The second layer 35-2 is made of p-$In_XAl_YGa_{1-X-Y}As$ ($0.52 \leq X \leq 0.53$, $0.17 \leq Y \leq 0.48$) compositionally graded downward from $In_{0.52}Al_{0.48}As$ to $In_{0.53}Al_{0.17}Ga_{0.3}As$ so that the second layer 35-2 may have a second graded energy band gap which proportionally narrows correspondingly from the maximum value of 1.45 eV to the minimum value of 0.95 eV. The second layer 35-2 has a thickness of 30 angstroms. Thus a pair of the first and second layers 35-1 and 35-2 has a thickness of 210 angstroms. The compositionally graded multiplication layer 35 comprising the fifteen periods of the first and second layers 35-1 and 35-2 has a thickness of 0.315 micrometers. An $n^+$-doped layer 36 having a thickness of 2 micrometers with an impurity concentration of $5\times10^{18}$ $cm^{-3}$ is formed on the compositionally graded multiplication layer 35. The above layers may be grown by a molecular beam epitaxy method on the semiconductor substrate 31 to form a wafer. The wafer is subsequently subjected to a lithography and a mesa etching to be shaped as illustrated in FIG. 6. A mesa portion formed on the semiconductor substrate 31 is covered with an insulation film 38 made of silicon nitride. A cathode electrode 20 is provided on a part of a top surface of the n+-doped layer 36. An anode electrode 19 is provided on a bottom surface of the semiconductor substrate 31. Wherein it is possible to provide a window for receiving photons from either top or bottom portions of the avalanche photodiode, in this embodiment the window for receiving photons is provided on the top surface of the $n^+$-doped layer 36.

The novel avalanche photodiode may function as a photo detector by reverse-biasing the anode and cathode electrodes 19 and 20. A photon or a plurality of photons are received through the window. The photons are then propagated through the $n^+$-doped layer 36, the compositionally graded multiplication layer 35 and the field relaxation layer 34 into the absorption layer 33 by which the photons may be absorbed. This absorption of photons by the absorption layer 33 generates electron-hole pairs. Since the anode and cathode electrodes have already been reverse-biased, the electrons and holes generated by the photon absorptions are being accelerated toward the cathode and anode electrodes 19 and 20 respectively. Namely, the holes are traveled through the buffer layer 32 and the semiconductor substrate 31 for subsequent arrival at the anode electrode 19. By contrast, the electrons generated by the photon absorption phenomenon may be traveled from the absorption layer 33 through the field relaxation layer 34 and the compositionally graded multiplication layer 35 where a large multiplication of the electron current appears. The electrons are further traveled through the n$^+$-doped layer 36 to the cathode electrode 20. Arrivals of the electrons and holes at the cathode and anode electrodes 20 and 19 respectively, means that the avalanche photodiode has just detected a photon or a plurality of photons.

The description will focus on the mechanism in impact ionization effect and the transportation of electrons and holes in the improved multiplication layer 35. When the compositionally graded p-In$_X$Al$_Y$Ga$_{1-X-Y}$As multiplication layer 35 is not biased, the energy band gap profile of the first and second layers 35-1 and 35-2 are not much different from FIG. 2 from which the compositional variation permits the compositionally graded p-In$_X$Al$_Y$Ga$_{1-X-Y}$As multiplication layer 35 to be free from either any discontinuities or step-like rapid variation of each of the conduction band edge and the valance band edge. When the compositionally graded multiplication layer 35 is reverse-biased, the energy band gap profile is as illustrated in FIG. 7. In this embodiment, the multiplication layer 35 is so designed that the electrons and holes are accelerated much faster in the high impurity concentration layers 35-12 than other layers, which energy band gap has the maximum value to enhance acceleration of electrons and holes to obtain a higher impact ionization rate than that of the first embodiment.

Figure 7:
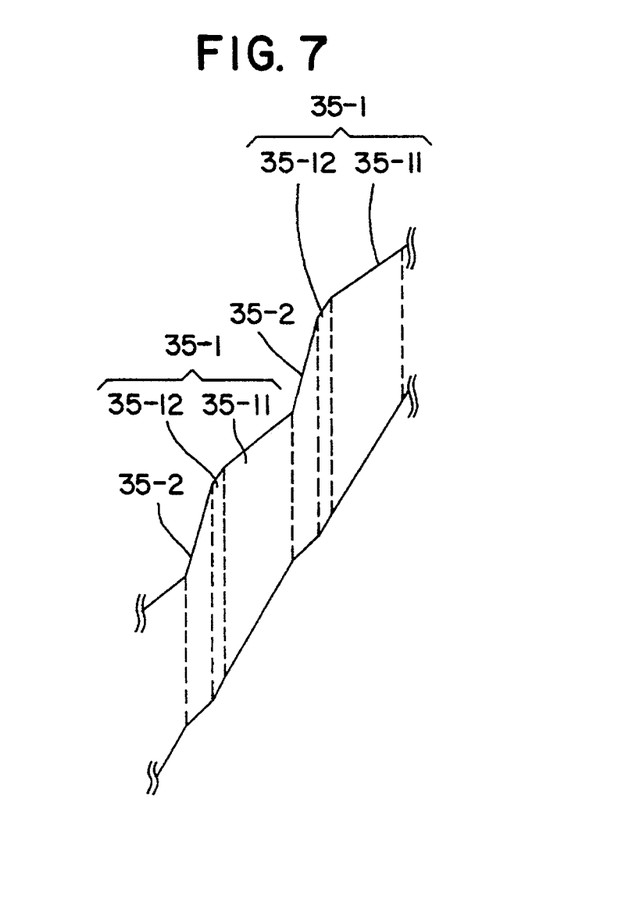
FIG. 7 is an energy band gap profile of an improved multiplication layer of an avalanche photodiode in a reverse-biased state of a third embodiment according to the present invention.

As illustrated in FIG. 7, when reverse-biased, both the conduction band edge and the valance band edge of the compositionally graded multiplication layer 35 are always sloped down in a direction toward which traveling electrons are being accelerated by an electric field due to the reverse-bias applied to the avalanche photodiode. This permits electrons to travel down on the conduction band edge being always sloped down without experiencing any potential barrier. This also permits holes to travel up on the valance band edge being always sloped up without experiencing any potential barrier. It would be extremely important to note that to realize a high frequency and high speed performance, not only electrons but also holes may travel on the conduction and valance band edges without experiencing any potential barrier.

The above improved compositionally graded multiplication layer 23 permits the electrons and holes to reach the cathode and anode electrodes without experiencing any potential barrier within a very short time after the photons were absorbed by the absorption layer 33. This permits the avalanche photodiode to achieve a very high speed performance and possesses an extremely high cut off frequency property or a high frequency performance. The above compositionally graded multiplication layer 35 further permits a large impact ionization rate which provides a high multiplication factor. This further permits the avalanche photodiode to become highly sensitive. In this embodiment, 6 or more high impact ionization rates for the electrons and holes are obtained. The multiplication factor of more than 10 and a high frequency performance of more than 150 GHz are obtained.

Whereas modifications of the present invention will no doubt be apparent to a person having ordinary skill in the art, to which the invention pertains, it is to be understood that the embodiments are by no means intended to be restrictive. Accordingly, it is to be intended by the claims to cover all modifications of the invention which fall within the spirit and scope of the invention.

What is claimed is:

1. An avalanche multilayer structure exhibiting an avalanche phenomenon comprising:
a plurality of periods, each of said periods comprising:
   a first layer having a first graded energy band gap being gradually increased in a direction toward which traveling electrons are being accelerated by a predetermined electric field; and
   a second layer having a second graded energy band gap being gradually decreased in said direction so that both a conduction band edge and a valance band edge are free from any discontinuities and are sloped down toward said direction through said first and second layers when said first and second layers are being applied with said electric field.

2. The avalanche multilayer structure as claimed in claim 1, wherein:
   said first layer has a first thickness and has a graded energy band gap being proportionally increased in said direction from a minimum value to a maximum value; and
   said second layer has a second thickness thinner than said first thickness and has a graded energy band gap being proportionally decreased in said direction from said maximum value to said minimum value.

3. The avalanche multilayer structure as claimed in claim 2, wherein said first thickness is 150 angstroms and said second thickness is 50 angstroms.

4. The avalanche multilayer structure as claimed in claim 2, wherein said maximum value is 1.45 eV and said minimum value is 0.75 eV.

5. The avalanche multilayer structure as claimed in claim 2, wherein said first and second layers are made of a compositionally graded In$_X$Al$_Y$Ga$_{1-X-Y}$As (0.52≦X≦0.53, 0≦Y≦0.48).

6. The avalanche multilayer structure as claimed in claim 1, wherein each one of said periods further comprising:
   a third layer being in contact with said first layer, said third layer having a third graded energy band gap being gradually increased in a direction toward which traveling electrons are being accelerated by a predetermined electric field; and
   a fourth layer being in contact with said third and fourth layers at its opposite sides, said fourth layer having a fourth graded energy band gap being gradually decreased in said direction so that both a conduction band edge and a valance band edge are free from any discontinuities and are sloped down toward said direction through said first to fourth layers when said first to fourth layers are being applied with said electric field.

7. The avalanche multilayer structure as claimed in claim 6, wherein:
   said third layer has a third thickness and has a graded energy band gap being proportionally increased in said direction until reaching maximum value; and
   said fourth layer has a fourth thickness thinner than said third thickness and has a graded energy band gap being proportionally decreased in said direction from said maximum value.

8. The avalanche multilayer structure as claimed in claim 6, wherein said third thickness is 20 angstroms and said fourth thickness is 10 angstroms.

9. The avalanche multilayer structure as claimed in claim 6, wherein said maximum value is 1.57 eV and said minimum value is 0.95 eV.

10. The avalanche multilayer structure as claimed in claim 6, wherein said first to fourth layers are made of a compositionally graded In$_X$Al$_Y$Ga$_{1-X-Y}$As (0.45≦X≦0.53, 0.17≦Y≦0.55).

11. The avalanche multilayer structure as claimed in claim 1, wherein said first and second layers have a uniform impurity concentration of $1\times10^{15}$ cm$^{-3}$.

12. The avalanche multilayer structure as claimed in claim 6, wherein said first to fourth layers have a uniform impurity concentration of $1\times10^{15}$ cm$^{-3}$.

13. The avalanche multilayer structure as claimed in claim 7, wherein said first and second layers have a high impurity concentration of $3\times10^{16}$ cm$^{-3}$ in a vicinity where said energy band gap has reached said maximum value and a low impurity concentration of $1\times10^{15}$ cm$^{-3}$ in the remaining portion.

14. The avalanche multilayer structure as claimed in claim 13, wherein said first to fourth layer are made of a compositionally graded $In_XAl_YGa_{1-X-Y}As$ ($0.52 \leq X \leq 0.53$, $0.17 \leq Y \leq 0.48$).

15. The avalanche multilayer structure as claimed in claim 7, wherein said first to fourth layers have a high impurity concentration of $3\times10^{16}$ cm$^{-3}$ in a vicinity where said energy band gap has reached said maximum value and a low impurity concentration of $1\times10^{15}$ cm$^{-3}$ in the remaining portion.

16. An avalanche photodiode multilayer structure comprising:

an absorption layer for absorbing photons and subsequent generation of electron hole pairs;

a field relaxation layer in contact with said absorption layer; and a multiplication layer in contact with said field relaxation layer, said multiplication layer comprising a plurality of periods, each of said periods further comprising a first layer and a second layer in which said first layer has a first graded energy band gap being gradually increased in a direction toward which traveling electrons are being accelerated by a predetermined electric field and said second layer has a second graded energy band gap being gradually decreased in said direction so that both a conduction band edge and a valance band edge are free from any discontinuities and are sloped down toward said direction through said first and second layers when said first and second layers are being applied with said electric field.

17. The avalanche multilayer structure as claimed in claim 16, wherein:

said first layer has a first thickness and has a graded energy band gap being proportionally increased in said direction from a minimum value to a maximum value; and said second layer has a second thickness thinner than said first thickness and has a graded energy band gap being proportionally decreased in said direction from said maximum value to said minimum value.

18. The avalanche multilayer structure as claimed in claim 17, wherein said first thickness is 150 angstroms and said second thickness is 50 angstroms.

19. The avalanche multilayer structure as claimed in claim 17, wherein said maximum value is 1.45 eV and said minimum value is 0.75 eV.

20. The avalanche multilayer structure as claimed in claim 17, wherein said first and second layers are made of a compositionally graded $In_XAl_YGa_{1-X-Y}As$ ($0.52 \leq X \leq 0.53$, $0 \leq Y \leq 0.48$).

21. The avalanche multilayer structure as claimed in claim 16, wherein said each period further comprises:

a third layer being in contact with said first layer, said third layer having a third graded energy band gap being gradually increased in a direction toward which traveling electrons are being accelerated by a predetermined electric field; and a fourth layer being in contact with said fourth and third layers at its opposite sides, said fourth layer having a fourth graded energy band gap being gradually decreased in said direction so that both a conduction band edge and a valance band edge are free from any discontinuities and are sloped down toward said direction through said first to fourth layers when said first to fourth layers are being applied with said electric field.

22. The avalanche multilayer structure as claimed in claim 21, wherein:

said third layer has a third thickness and has a graded energy band gap being proportionally increased in said direction to a maximum value; and said fourth layer has a fourth thickness thinner than said third thickness and has a graded energy band gap being proportionally decreased in said direction from said maximum value.

23. The avalanche multilayer structure as claimed in claim 21, wherein said third thickness is 20 angstroms and said fourth thickness is 10 angstroms.

24. The avalanche multilayer structure as claimed in claim 21, wherein said maximum value is 1.57 eV and said minimum value is 0.95 eV.

25. The avalanche multilayer structure as claimed in claim 21, wherein said first to fourth layers are made of a compositionally graded $In_XAl_YGa_{1-X-Y}As$ ($0.45 \leq X \leq 0.53$, $0.17 \leq Y \leq 0.55$).

26. The avalanche multilayer structure as claimed in claim 16, wherein said first and second layers have a uniform impurity concentration of $1\times10^{15}$ cm$^{-3}$.

27. The avalanche multilayer structure as claimed in claim 21, wherein said first to fourth layers have a uniform impurity concentration of $1\times10^{15}$ cm$^{-3}$.

28. The avalanche multilayer structure as claimed in claim 17, wherein said first and second layers have a high impurity concentration of $3\times10^{16}$ cm$^{-3}$ in a vicinity where said energy band gap has reached said maximum value and a low impurity concentration of $1\times10^{15}$ cm$^{-3}$ in the remaining portion.

29. The avalanche multilayer structure as claimed in claim 28, wherein said first to fourth layers are made of a compositionally graded $In_XAl_YGa_{1-X-Y}As$ ($0.52 \leq X \leq 0.53$, $0.17 \leq Y \leq 0.48$).

30. The avalanche multilayer structure as claimed in claim 22, wherein said first to fourth layers have a high impurity concentration of $3\times10^{16}$ cm$^{-3}$ in a vicinity where said energy band gap has reached said maximum value and a low impurity concentration of $1\times10^{15}$ cm$^{-3}$ in the remaining portion.

31. An avalanche photodiode comprising:

a semiconductor substrate;

a buffer layer formed on said semiconductor substrate;

a multiplication layer formed on said buffer layer, said multiplication layer comprising a plurality of periods, each of said periods further comprising a first and a second layer in which said first layer has a first graded energy band gap being gradually increased in a direction toward which traveling electrons are being accelerated by a predetermined electric field and said second layer has a second graded energy band gap being gradually decreased in said direction so that both a conduction band edge and a valance band edge are free from any discontinuities and are sloped down toward said direction through said first and second layers when said first and second layers are being applied with said electric field;

a field relaxation layer formed on said multiplication layer;

an absorption layer formed on said field relaxation layer for absorbing photons and subsequent generation of electron hole pairs;

a cap layer formed on said absorption layer;

a contact layer formed on said cap layer;

an anode electrode situated on a top surface of said contact layer; and a cathode electrode situated on a bottom surface of said semiconductor substrate.

32. The avalanche multilayer structure as claimed in claim 31, wherein:

said first layer has a thickness of 150 angstroms and has a graded energy band gap being proportionally increased in said direction from a minimum value of 0.75 eV to a maximum value of 1.45 eV; and said second layer has a thickness of 50 angstroms and has a graded energy band gap being proportionally decreased in said direction from said maximum value to said minimum value.

33. The avalanche multilayer structure as claimed in claim 32, wherein said first and second layers are made of a compositionally graded $In_xAl_yGa_{1-x-y}As$ ($0.52 \leq X \leq 0.53$, $0 \leq Y \leq 0.48$).

34. The avalanche multilayer structure as claimed in claim 31, wherein each one of said periods further comprising:

a third layer being in contact with said first layer, said third layer having a third graded energy band gap being gradually increased in a direction toward which traveling electrons are being accelerated by a predetermined electric field; and a fourth layer being in contact with said fourth and third layers at its opposite sides, said fourth layer having a fourth graded energy band gap being gradually reduced in said direction so that both a conduction band edge and a valance band edge are free from any discontinuities and are sloped down toward said direction through said first to fourth layers when said first to fourth layers are being applied with said electric field.

35. The avalanche multilayer structure as claimed in claim 34, wherein:

said third layer has a thickness of 20 angstroms and has a graded energy band gap being proportionally increased in said direction to a maximum value of 1.57 eV; and said fourth layer has a thickness of 10 angstroms and has a graded energy band gap being proportionally decreased in said direction from said maximum value.

36. The avalanche multilayer structure as claimed in claim 34, wherein said first to fourth layers are made of a compositionally graded $In_xAl_yGa_{1-x-y}As$ ($0.45 \leq X \leq 0.53$, $0.17 \leq Y \leq 0.55$).

37. The avalanche multilayer structure as claimed in claim 31, wherein said first and second layers have a uniform impurity concentration of $1 \times 10^{15}$ cm$^{-3}$.

38. The avalanche multilayer structure as claimed in claim 34, wherein said first to fourth layers have a uniform impurity concentration of $1 \times 10^{15}$ cm$^{-3}$.

39. The avalanche multilayer structure as claimed in claim 32, wherein said first and second layers have a high impurity concentration of $3 \times 10^{16}$ cm$^{-3}$ in a vicinity where said energy band gap has reached said maximum value and a low impurity concentration of $1 \times 10^{15}$ cm$^{-3}$ in the remaining portion.

40. The avalanche multilayer structure as claimed in claim 39, wherein said first to fourth layers are made of a compositionally graded $In_xAl_yGa_{1-x-y}As$ ($0.52 \leq X \leq 0.53$, $0.17 \leq Y \leq 0.48$).

41. The avalanche multilayer structure as claimed in claim 34, wherein said first to fourth layers have a high impurity concentration of $3 \times 10^{16}$ cm$^{-3}$ in a vicinity where said energy band gap has reached said maximum value and a low impurity concentration of $1 \times 10^{15}$ cm$^{-3}$ in the remaining portion.

42. An avalanche photodiode comprising:

a semiconductor substrate having a first conductivity type;

a buffer layer having said first conductivity type formed on said semiconductor substrate;

an absorption layer having said first conductivity type formed on said buffer layer for absorbing photons and subsequent generation of electron hole pairs;

a field relaxation layer having said first conductivity type formed on said absorption layer;

a multiplication layer having said first conductivity type formed on said field relaxation layer, said multiplication layer comprising a plurality of periods, each of said periods further comprising a first layer and a second layer in which said first layer has a first graded energy band gap being gradually increased in a direction toward which traveling electrons are being accelerated by a predetermined electric field and said second layer has a second graded energy band gap being gradually decreased in said direction so that both a conduction band edge and a valance band edge are free from any discontinuities and are sloped down toward said direction through said first and second layers when said first and second layers are being applied with said electric field;

a layer having a second conductivity type formed on said multiplication layer;

a cathode electrode situated on a top surface of said second conductivity type layer; and an anode electrode situated on a bottom surface of said semiconductor substrate.

43. The avalanche multilayer structure as claimed in claim 42, wherein:

said first layer has a thickness of 150 angstroms and has a graded energy band gap being proportionally increased in said direction from a minimum value of 0.75 eV to a maximum value of 1.45 eV; and said second layer has a thickness of 50 angstroms and has a graded energy band gap being proportionally decreased in said direction from said maximum value to said minimum value.

44. The avalanche multilayer structure as claimed in claim 43, wherein said first and second layers are made of a compositionally graded $In_xAl_yGa_{1-x-y}As$ ($0.52 \leq X \leq 0.53$, $0 \leq Y \leq 0.48$).

45. The avalanche multilayer structure as claimed in claim 42, wherein each one of said periods further comprising:

a third layer being in contact with said first layer, said third layer having a third graded energy band gap being gradually increased in a direction toward which traveling electrons are being accelerated by a predetermined electric field; and a fourth layer being in contact with said fourth and third layers at its opposite sides, said fourth layer having a fourth graded energy band gap being gradually decreased in said direction so that both a conduction band edge and a valance band edge are free from any discontinuities and are sloped down toward said direction through said first to fourth layers when said first to fourth layers are being applied with said electric field.

46. The avalanche multilayer structure as claimed in claim 45, wherein:

said third layer has a thickness of 20 angstroms and has a graded energy band gap being proportionally increased in said direction to a maximum value of 1.57 eV; and said fourth layer has a thickness of 10 angstroms and has a graded energy band gap being proportionally decreased in said direction from said maximum value.

47. The avalanche multilayer structure as claimed in claim 45, wherein said first to fourth layers are made of a compositionally graded $In_XAl_YGa_{1-X-Y}As$ ($0.45 \leq X \leq 0.53$, $0.17 \leq Y \leq 0.55$).

48. The avalanche multilayer structure as claimed in claim 42, wherein said first and second layers have a uniform impurity concentration of $1 \times 10^{15}$ cm$^{-3}$.

49. The avalanche multilayer structure as claimed in claim 45, wherein said first to fourth layers have a uniform impurity concentration of $1 \times 10^{15}$ cm$^{-3}$.

50. The avalanche multilayer structure as claimed in claim 43, wherein said first and second layers have a high impurity concentration of $3 \times 10^{16}$ cm$^{-3}$ in a vicinity where said energy band gap has reached said maximum value and a low impurity concentration of $1 \times 10^{15}$ cm$^{-3}$ in the remaining portion.

51. The avalanche multilayer structure as claimed in claim 50, wherein said first to fourth layers are made of a compositionally graded $In_XAl_YGa_{1-X-Y}As$ ($0.52 \leq X \leq 0.53$, $0.17 \leq Y \leq 0.48$).

52. The avalanche multilayer structure as claimed in claim 45, wherein said first to fourth layers have a high impurity concentration of $3 \times 10^{16}$ cm$^{-3}$ in a vicinity where said energy band gap has said maximum value and a low impurity concentration of $1 \times 10^{15}$ cm$^{-3}$ in the remaining portion.

* * * * *